(12) United States Patent
Sonoda et al.

(10) Patent No.: US 10,270,061 B2
(45) Date of Patent: Apr. 23, 2019

(54) ELECTROLUMINESCENT DEVICE AND MANUFACTURING METHOD

(71) Applicant: Sharp Kabushiki Kaisha, Sakai, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Daichi Nishikawa, Sakai (JP); Mamoru Ishida, Sakai (JP)

(73) Assignee: Sharp Kabushiki Kaisha, Sakai, Osaka (JP)

( * ) Notice: Subject to any disclaimer, the term of this patent is extended or adjusted under 35 U.S.C. 154(b) by 0 days.

(21) Appl. No.: 15/555,146

(22) PCT Filed: Feb. 25, 2016

(86) PCT No.: PCT/JP2016/055548
§ 371 (c)(1),
(2) Date: Sep. 1, 2017

(87) PCT Pub. No.: WO2016/140130
PCT Pub. Date: Sep. 9, 2016

(65) Prior Publication Data
US 2018/0047940 A1    Feb. 15, 2018

(30) Foreign Application Priority Data
Mar. 3, 2015    (JP) .................. 2015-041687

(51) Int. Cl.
| H01L 51/52 | (2006.01) |
| H05B 33/04 | (2006.01) |
| H01L 51/00 | (2006.01) |
| H01L 51/56 | (2006.01) |
| H01L 27/32 | (2006.01) |

(52) U.S. Cl.
CPC ...... *H01L 51/5256* (2013.01); *H01L 51/0097* (2013.01); *H01L 51/5246* (2013.01); (Continued)

(58) Field of Classification Search
CPC ......... H01L 51/52; H01L 51/56; H01L 51/00; H01L 51/0097; H01L 51/5256; (Continued)

(56) References Cited

U.S. PATENT DOCUMENTS

2010/0244005 A1    9/2010   Gyoda
2010/0261017 A1    10/2010  Kikuchi
(Continued)

FOREIGN PATENT DOCUMENTS

JP    2001-307873 A    11/2001
JP    2003-017244 A    1/2003
(Continued)

OTHER PUBLICATIONS

Official Communication issued in International Patent Application No. PCT/JP2016/055548, dated May 31, 2016.

*Primary Examiner* — Chuong A Luu
(74) *Attorney, Agent, or Firm* — Keating & Bennett, LLP

(57) ABSTRACT

An organic EL display device including a TFT substrate (substrate) and an organic EL element (electroluminescent element) that is provided on the TFT substrate includes a sealing layer that seals the organic EL element. The sealing layer is composed of a laminated structure that is constituted by an organic film and first and second inorganic films. Recessed/protruding portions are provided on surfaces of the organic film and the first and second inorganic films.

19 Claims, 14 Drawing Sheets

(52) U.S. Cl.
CPC ............. *H01L 51/56* (2013.01); *H05B 33/04* (2013.01); *H01L 27/3244* (2013.01)

(58) Field of Classification Search
CPC ............. H01L 51/5246; H01L 51/5275; H01L 51/5262; H01L 51/5203; H01L 27/3244; H01L 23/498; H01L 23/49838; H01L 23/49827; H01L 23/49811
USPC .......................................................... 257/40
See application file for complete search history.

(56) References Cited

U.S. PATENT DOCUMENTS

| | | |
|---|---|---|
| 2011/0079797 A1 | 4/2011 | Sumida et al. |
| 2011/0234088 A1 | 9/2011 | Abe |
| 2012/0206036 A1 | 8/2012 | Tanaka et al. |
| 2012/0256201 A1 | 10/2012 | Lee et al. |
| 2015/0171370 A1 | 6/2015 | Ehrensperger et al. |
| 2018/0040672 A1* | 2/2018 | Park .................. H01L 27/323 |

FOREIGN PATENT DOCUMENTS

| | | |
|---|---|---|
| JP | 2008-066027 A | 3/2008 |
| JP | 2010-231979 A | 10/2010 |
| JP | 2010-247369 A | 11/2010 |
| JP | 2011-081916 A | 4/2011 |
| JP | 2011-204377 A | 10/2011 |
| JP | 2012-186153 A | 9/2012 |
| WO | 2013/175130 A1 | 11/2013 |
| WO | 2014/109047 A1 | 7/2014 |

* cited by examiner

ELECTROLUMINESCENT DEVICE AND MANUFACTURING METHOD

TECHNICAL FIELD

The present invention relates to an electroluminescent device having an EL (electroluminescent) element and a method for manufacturing the same.

BACKGROUND ART

In recent years, flat panel displays are used in a variety of commercial products and fields, and there is demand to further increase the size, improve the image quality, and reduce the power consumption of flat panel displays.

In these circumstances, organic EL display devices equipped with organic EL (electroluminescent) elements that use the electroluminescence (Electro Luminescence) of organic materials are recognized as all-solid-state flat panel displays that are excellent in terms of their low-voltage driving capability, fast responsiveness, self-luminous properties, and the like, and are attracting considerable attention.

For example, in an active-matrix organic EL display device, a thin film organic EL element is provided on a substrate on which a TFT (thin-film transistor) is provided. In the organic EL element, an organic EL layer including a light emitting layer is laminated between a pair of electrodes. The TFT is connected to one of the pair of electrodes. When a voltage is applied across the pair of electrodes, the light emitting layer emits light, and thus an image is displayed.

Moreover, with respect to a conventional organic EL display device such as that described above, it is known that, in order to prevent deterioration of an organic EL element that is caused by moisture or oxygen, the organic EL element is provided with a sealing layer.

Moreover, with respect to a conventional organic EL display device such as that described above, as disclosed in Patent Documents 1 and 2 below, for example, a proposal has been made to provide a sealing layer on an organic EL element, the sealing layer being constituted by a resin sealing film (organic film) and an inorganic passivation sealing film (inorganic film) that are alternately laminated. It has been considered that deterioration of the organic EL element of this conventional organic EL display device due to moisture or oxygen can be prevented by the sealing layer.

CITATION LIST

Patent Documents

Patent Document 1: JP 2001-307873A
Patent Document 2: JP 2003-17244A

DISCLOSURE OF INVENTION

Problem to be Solved by the Invention

However, with respect to conventional organic EL display devices such as those described above, since a sealing layer including an organic film and an inorganic film is provided on an organic EL element (electroluminescent element), there are cases where color unevenness occurs in an image displayed by the organic EL element, or the display image is indistinct. Thus, there are cases where the problem occurs in that optical characteristics of the organic EL display device cannot be easily improved.

In view of the above-described problem, an object of the present invention is to provide an electroluminescent device whose optical characteristics can be improved in a simple manner and a method for manufacturing the electroluminescent device.

Means for Solving Problem

In order to attain the above-described object, an electroluminescent device according to the present invention is an electroluminescent device including:
a substrate;
an electroluminescent element that is provided on the substrate; and
a sealing layer that seals the electroluminescent element,
wherein the sealing layer includes an inorganic film and an organic film, and recessed/protruding portions are provided on a surface of at least the inorganic film.

In the electroluminescent device that is configured as described above, the sealing layer seals the electroluminescent element. Moreover, the recessed/protruding portions are provided on the surface of at least the inorganic film of the inorganic film and the organic film included in the sealing layer. Thus, unlike the above-described conventional examples, an electroluminescent device whose optical characteristics can be improved in a simple manner can be configured.

Moreover, in the electroluminescent device, the sealing layer may include a first inorganic film, an organic film, and a second inorganic film that are sequentially provided from the electroluminescent element side, and
recessed/protruding portions may be provided on surfaces of at least the first and second inorganic films.

In this case, since the first inorganic film, the organic film, and the second inorganic film are included in the sealing layer, an electroluminescent device with excellent barrier properties for the electroluminescent element can be easily configured.

Moreover, in the electroluminescent device, the organic film may be planarized.

In this case, the second inorganic film can be easily formed.

Moreover, in the electroluminescent device, it is preferable that the recessed/protruding portions are aperiodically provided.

In this case, scattering of light can be facilitated, and thus, optical interference can be suppressed. As a result, an electroluminescent device having excellent optical characteristics can be easily configured.

Moreover, in the electroluminescent device, it is preferable that recessed/protruding dimensions of the recessed/protruding portions are values within a range of 30 nm to 300 nm.

In this case, minute recesses and protrusions are formed at the recessed/protruding portions, so that optical characteristics can be improved in a simpler manner, and also the adhesion at an interface with a film provided with the recessed/protruding portions can be improved.

Moreover, the electroluminescent device may further include:
an opposing substrate that opposes the substrate; and
a frame-like sealing material that is provided between the substrate and the opposing substrate and that encloses the electroluminescent element together with the substrate and the opposing substrate.

In this case, deterioration of the electroluminescent element can be more reliably prevented.

Moreover, in the electroluminescent device, it is preferable that a filler layer is provided among the substrate, the opposing substrate, and the sealing material.

In this case, the barrier properties for the electroluminescent element can be increased even more.

Moreover, in the electroluminescent device, a material having flexibility may be used for the substrate.

In this case, a bendable electroluminescent device can be easily configured.

Moreover, a method for manufacturing an electroluminescent device according to the present invention is a method for manufacturing an electroluminescent device including a substrate and an electroluminescent element that is provided on the substrate, the method including:

a sealing layer forming step of forming a sealing layer that includes an inorganic film and an organic film and that seals the electroluminescent element, wherein the sealing layer forming step includes an inorganic film forming step of forming the inorganic film by using plasma CVD, and the inorganic film forming step includes an intermittent plasma processing step of forming recessed/protruding portions on a surface of the inorganic film by turning on and off power supply of plasma.

In the method for manufacturing an electroluminescent device that is configured as described above, the recessed/protruding portions are formed on the surface of the inorganic film by performing the intermittent plasma processing step. Thus, unlike the above-described conventional examples, an electroluminescent device whose optical characteristics can be improved in a simple manner can be configured.

Moreover, in the method for manufacturing an electroluminescent device, the sealing layer forming step may include:

a first inorganic film forming step of forming a first inorganic film on the electroluminescent element by using plasma CVD;

an organic film forming step of forming an organic film on the first inorganic film by using CVD, sputtering, vapor deposition, or vapor deposition polymerization; and a second inorganic film forming step of forming a second inorganic film on the organic film by using plasma CVD, and the first and second inorganic film forming steps may include the intermittent plasma processing step.

In this case, since the first inorganic film, the organic film, and the second inorganic film are included in the sealing layer, an electroluminescent device with excellent barrier properties for the electroluminescent element can be easily configured.

Moreover, in the method for manufacturing an electroluminescent device, it is preferable that the first inorganic film forming step, the organic film forming step, and the second inorganic film forming step are successively performed within the same chamber.

In this case, an electroluminescent device that is inexpensive in cost can be easily configured by simplifying the manufacturing steps, and also deterioration in reliability of the electroluminescent device due to contamination of dust or intrusion of oxygen and/or moisture can be suppressed in a simple manner.

Moreover, in the method for manufacturing an electroluminescent device, the organic film forming step may include a planarization step of planarizing the organic film.

In this case, the second inorganic film can be easily formed.

Moreover, in the method for manufacturing an electroluminescent device, it is preferable that, in the intermittent plasma processing step, power supply of the plasma is turned on for 10 to 120 seconds and then turned off for 1 to 10 seconds.

In this case, the recessed/protruding portions can be properly formed, and thus, an electroluminescent device whose optical characteristics can be improved in a simple manner can be reliably configured.

Effects of the Invention

According to the present invention, it is possible to provide an electroluminescent device whose optical characteristics can be improved in a simple manner and a method for manufacturing the electroluminescent device.

BRIEF DESCRIPTION OF DRAWINGS

FIGS. 6(a) to 6(c) illustrate a series of main manufacturing steps.

DESCRIPTION OF THE INVENTION

Figure 1:
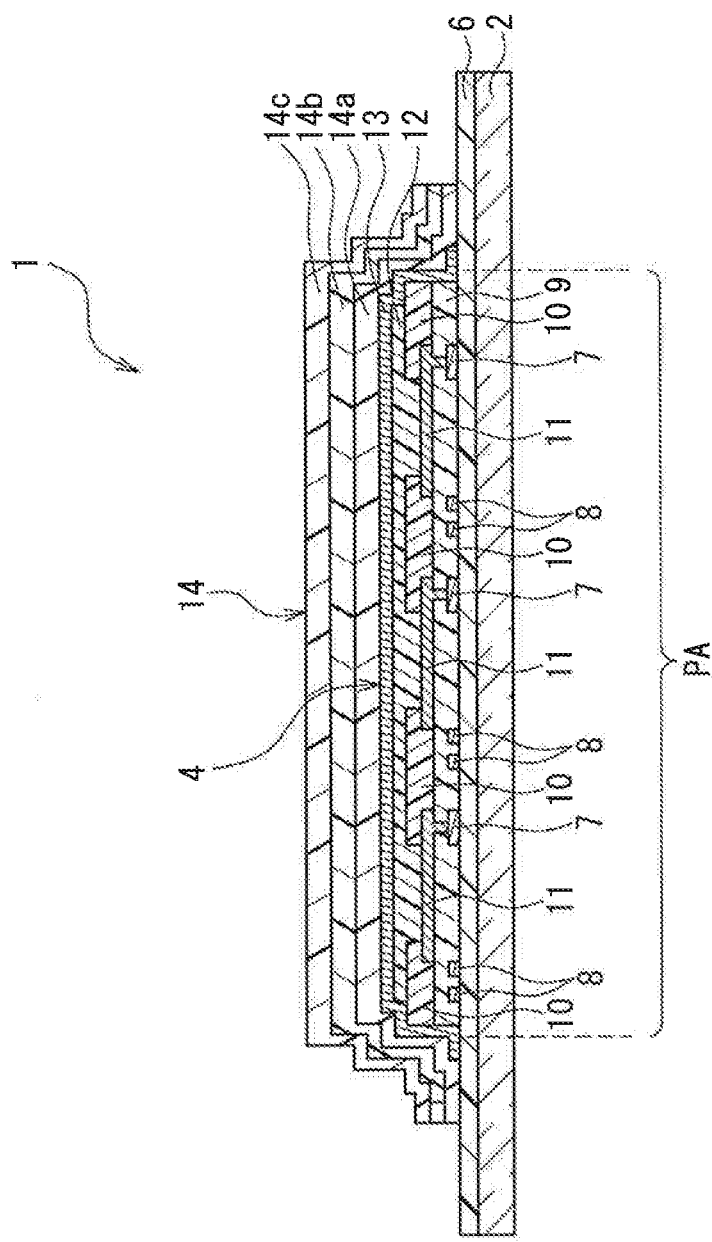
FIG. 1 is a cross-sectional view showing a cross section of an organic EL display device according to a first embodiment of the present invention.

Hereinafter, preferred embodiments of an electroluminescent device and a method for manufacturing the electroluminescent device of the present invention will be described with reference to the drawings. It should be noted that, in the following description, a case where the present invention is applied to an organic EL display device will be described by way of example. Moreover, it should be understood that the dimensions of various constituent members in the drawings are not faithful representations of the dimensions of actual constituent members, dimensional ratios of those constituent members, and the like.

First Embodiment

FIG. 1 is a cross-sectional view showing a cross section of an organic EL display device according to a first embodiment of the present invention. In FIG. 1, an organic EL display device 1 of the present embodiment includes a TFT substrate 2 serving as a substrate and an organic EL element 4 serving as an electroluminescent (Electro Luminescence) element, the organic EL element 4 being provided on the TFT substrate 2.

In the organic EL display device 1 of the present embodiment, the organic EL element 4 constitutes a rectangular pixel area PA having a plurality of pixels (including a plurality of subpixels), and this organic EL element 4 is sealed by a sealing layer 14. Also, this pixel area PA constitutes a display portion of the organic EL display device 1 and is adapted to display information. That is to say, in this pixel area PA, as will be described later, the plurality of pixels (plurality of subpixels) are arranged in a matrix, and information is displayed by the organic EL element 4 emitting light on a subpixel-by-subpixel basis.

In FIG. 1, the TFT substrate 2 is composed of, for example, a glass material or a film or the like that has flexibility (bendability). A base film (insulation film) 6 is provided on the TFT substrate 2 such that the base film 6 covers the entire surface of the TFT substrate 2. As shown in FIG. 1 by way of example, in the organic EL display device 1, TFTs (thin-film transistors) 7 for the respective subpixels of the pixel area PA are provided on this base film 6. Also, interconnects 8 are formed on the base film 6, the interconnects 8 including a plurality of source lines (signal lines) and a plurality of gate lines that are arranged in a matrix. The source lines and the gate lines are connected to a source driver and a gate driver (not shown), respectively, and are adapted to drive the TFTs 7 for the respective subpixels in response to image signals input from the outside. Moreover, the TFTs 7 function as switching elements that control light emission of the corresponding subpixels, and are adapted to control light emission of the subpixels constituted by the organic EL element 4 and individually emitting the red (R), green (G), or blue (B) color.

It should be noted that the base film 6 is used to prevent deterioration in the characteristics of the TFTs 7 due to impurity diffusion from the TFT substrate 2 to the TFTs 7, and may be omitted if there is no need for concern about such deterioration.

In the case where a material having flexibility is used for the TFT substrate 2, a bendable organic EL display device 1 can be easily configured.

Moreover, in the case where the TFT substrate 2 is a film having flexibility, in order to prevent deterioration of the TFTs 7 and the organic EL element 4 due to moisture or oxygen permeating through (intruding) from the outside, a damp-proof layer constituted by an inorganic film made from silicon nitride, silicon oxynitride, or the like may also be formed on the TFT substrate 2 in advance.

Moreover, as shown in FIG. 1, an interlayer insulation film 9, edge covers 10, and first electrodes 11 of the organic EL element 4 are formed on the TFT substrate 2. The interlayer insulation film 9 functions also as a planarization film and is provided on the base film 6 so as to cover the TFTs 7 and the interconnects 8. The edge covers 10 are formed on the interlayer insulation film 9 such that the edge covers 10 cover pattern end portions of each of the first electrodes 11. The edge covers 10 are adapted to function also as an insulation layer for preventing short-circuiting of the first electrodes 11 and a second electrode 13, which will be described later. Moreover, the first electrodes 11 are connected to the TFTs 7 through contact holes that are formed in the interlayer insulation film 9.

Moreover, openings in the edge covers 10, that is, portions through which the first electrodes 11 are exposed substantially constitute light-emitting regions of the organic EL element 4, which individually emit light in R, G, or B color as described above, and thus, the organic EL display device 1 of the present embodiment is configured to be capable of displaying in full color. Moreover, the organic EL display device 1 of the present embodiment constitutes an active-matrix display device having the TFTs (thin-film transistors) 7.

Moreover, as shown in FIG. 1, an organic EL layer 12 and the second electrode 13 are formed on the first electrodes 11. The organic EL element 4 is constituted by the first electrodes 11, the organic EL layer 12, and the second electrode 13. That is to say, the organic EL element 4 may be, for example, a light-emitting element capable of emitting light with high luminance by being driven with a low-voltage direct current, and includes the first electrodes 11, the organic EL layer 12, and the second electrode 13.

More specifically, in the case where the first electrodes 11 are anodes, a hole injection layer, a hole transport layer, a light-emitting layer, an electron transport layer, an electron injection layer, and the like are laminated (not shown) in that order from the first electrodes 11 side and together serve as the organic EL layer 12, and the second electrode 13 serving as a cathode is further formed thereon. Besides the above-described configuration, a configuration may also be adopted in which a single layer has two or more functions in such a manner that a hole injection layer doubles as a hole transport layer, for example. Also, a carrier blocking layer and the like may be inserted in the organic EL layer 12 as appropriate.

On the other hand, in the case where the second electrode 13 is an anode, the above-described order of the layers in the organic EL layer 12 is reversed.

Moreover, in the case where the first electrodes 11 are each constituted by a transparent electrode or a semi-transparent electrode and the second electrode 13 is constituted by a reflective electrode, the organic EL display device 1 is of a bottom emission type that emits light from the TFT substrate 2 side. That is to say, in this bottom emission-type organic EL display device 1, the surface of each first electrode 11 that faces toward the TFT substrate 2 constitutes a substantial light-emitting surface of the organic EL element 4 and is adapted to emit light outward.

Conversely, in the case where the first electrodes 11 are each constituted by a reflective electrode and the second electrode 13 is constituted by a transparent electrode or a semi-transparent electrode, the organic EL display device 1 is of a top emission type that emits light from the sealing layer 14. That is to say, in this top emission-type organic EL display device 1, the surface of each first electrode 11 that faces toward the sealing layer 14 constitutes a substantial light-emitting surface of the organic EL element 4 and is adapted to emit light outward.

In the organic EL display device 1 of the present embodiment, as described above, the organic EL element 4 is sealed by the sealing layer 14, and deterioration of the organic EL element 4 is prevented by the sealing layer 14 preventing moisture and oxygen permeating through (intruding) from the outside.

Moreover, the sealing layer 14 is constituted by a plurality of for example, three sealing films. That is to say, as shown in FIG. 1 by way of example, the sealing layer 14 is composed of a laminated structure that is constituted by a first inorganic film 14a that is provided on the organic EL element 4 side, an organic film 14b that is provided on the first inorganic film 14a, and a second inorganic film 14c that is provided on the organic film 14b.

Silicon nitride, silicon oxide, silicon oxynitride, aluminum oxide, or the like, for example, is used for the first and second inorganic films 14a and 14c. Organic silicon (organosilicon) such as polysiloxane or silicon oxycarbide, acrylate, polyurea, parylene, polyimide, polyamide, or the like, for example, is used for the organic film 14b. Furthermore, as will be described in detail later, the first and second inorganic films 14a and 14c and the organic film 14b are formed using masks of the same size, for example, and provided so as to be superposed one on top of another while having the same external shape.

Moreover, in the organic EL display device 1 of the present embodiment, since the first inorganic film 14a is provided on the organic EL element 4 side, an adverse effect of moisture on the organic EL element 4 can be more reliably prevented by the first inorganic film 14a. In addition, since the organic film 14b is provided on the first inorganic film 14a, even if stress relaxation of the first inorganic film 14a or a defect such as a pinhole or a partial loss due to a foreign substance occurs in the first inorganic film 14a, the first inorganic film 14a can be covered by the organic film 14b, so that deterioration in the sealing properties of the sealing layer 14 can be more reliably prevented.

Furthermore, in the organic EL display device 1 of the present embodiment, recessed/protruding portions are formed on a surface of each of the first inorganic film 14a, the organic film 14b, and the second inorganic film 14c, so that optical characteristics of the organic EL display device 1 can be improved in a simple manner (further details will be described later).

Next, the pixel area PA of the organic EL display device 1 of the present embodiment will be specifically described with reference also to FIG. 2.

Figure 2:
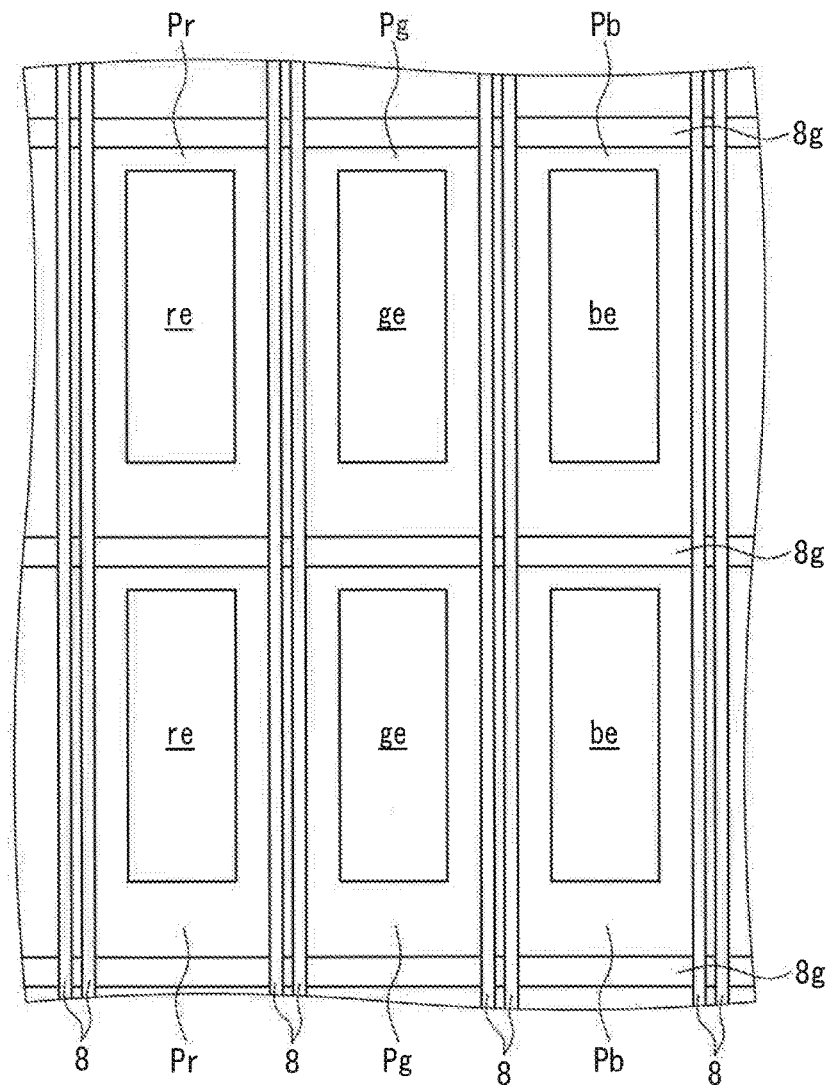
FIG. 2 is an enlarged plan view illustrating a pixel configuration of the organic EL display device.

FIG. 2 is an enlarged plan view illustrating a pixel configuration of the above-described organic EL display device.

As shown in FIG. 2, in the pixel area PA (FIG. 1) of the organic EL display device 1 of the present embodiment, red, green, and blue subpixels Pr, Pg, and Pb (hereinafter collectively referred to as "subpixels P") that emit light in red (R), green (G), and blue (B) colors, respectively, are arranged in a matrix. That is to say, the plurality of subpixels P are individually demarcated by two interconnects 8 and a gate line 8g that is connected to the gates of the TFTs 7. More specifically, the dimension of the pixel area of each subpixel P in the left-right direction in FIG. 2 is the dimension between a center line of two interconnects 8 that are arranged close to each other and a center line of two interconnects 8 that are adjacent to the aforementioned two interconnects 8, which are arranged close to each other, in the left-right direction in FIG. 2. Also, the dimension of the pixel area of each subpixel P in the up-down direction in FIG. 2 is the dimension between the centers of two gate lines 8g that are adjacent to each other. Moreover, the area of the pixel area of each subpixel P is defined by the above-described dimensions in the left-right direction and the up-down direction in FIG. 2.

Moreover, in the pixel area PA, one pixel is composed of a set of red, green, and blue subpixels Pr, Pg, and Pb.

Furthermore, in a red subpixel Pr, a portion that is exposed from an opening re in the edge covers 10 constitutes a substantial light-emitting region of that red subpixel Pr. Similarly, in a green subpixel Pg, a portion that is exposed from an opening ge in the edge covers 10 constitutes a substantial light-emitting region of that green subpixel Pg, and in a blue subpixel Pb, a portion that is exposed from an opening be in the edge covers 10 constitutes a substantial light-emitting region of that blue subpixel Pb.

Next, the sealing layer 14 of the organic EL display device 1 of the present embodiment will be specifically described with reference to FIG. 3.

Figure 3:
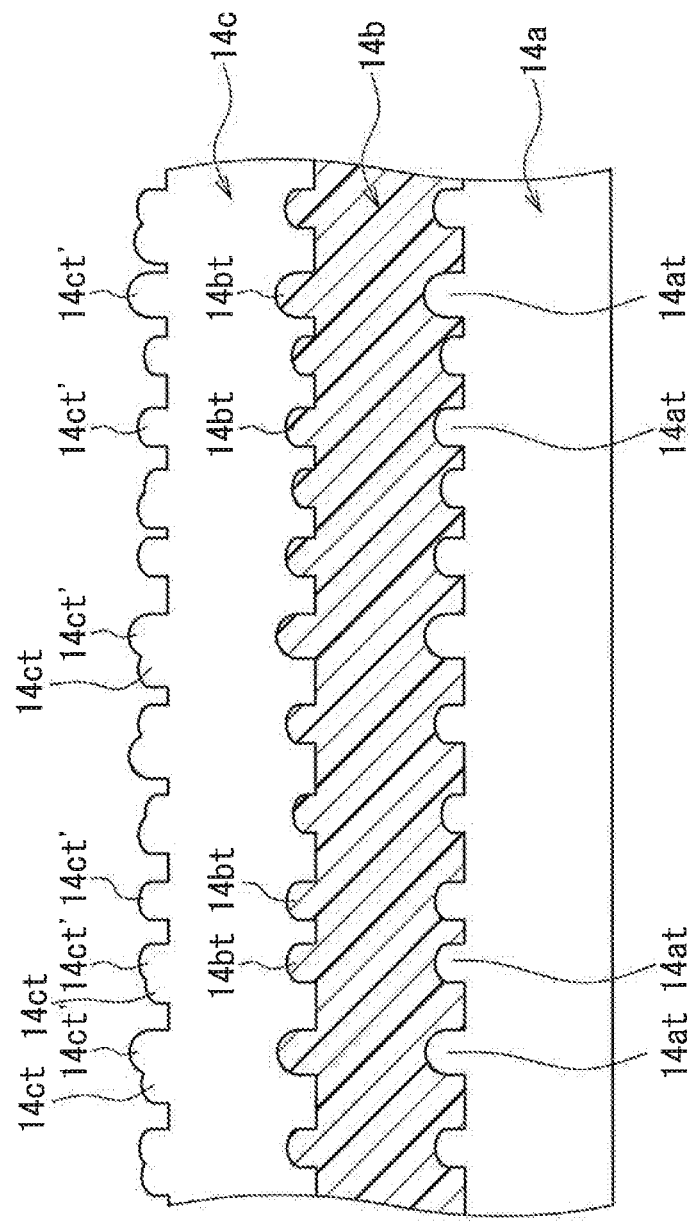
FIG. 3 is an enlarged cross-sectional view showing a specific configuration of a sealing layer shown in FIG. 1.

FIG. 3 is an enlarged cross-sectional view showing a specific configuration of the sealing layer shown in FIG. 1.

As shown in FIG. 3, recessed/protruding portions 14at are provided on a surface of the first inorganic film 14a that faces toward the organic film 14b. The recessed/protruding portions 14at are formed by performing an intermittent plasma processing step, which will be described later, when forming the first inorganic film 14a, and the recessed/protruding shapes of the recessed/protruding portions 14at are aperiodically (randomly) provided on the aforementioned surface. In addition, the recessed/protruding dimensions (i.e., dimensions of the differences in height of the recessed/protruding shapes on the aforementioned surface) of the recessed/protruding portions 14at are values within a range of several tens of nanometers to several hundreds of nanometers, for example, and preferably 30 nm to 300 nm.

Also, as shown in FIG. 3, recessed/protruding portions 14bt are provided on a surface of the organic film 14b that faces toward the second inorganic film 14c. The recessed/protruding portions 14bt are formed in accordance with the recessed/protruding portions 14at, which have been provided on the first inorganic film 14a, during formation of the organic film 14b. That is to say, the formation positions of the recessed/protruding shapes as well as the recessed/protruding dimensions of the recessed/protruding portions 14bt are exactly the same as those of the recessed/protruding portions 14at. In other words, the entire organic film 14b has a uniform film thickness.

Also, as shown in FIG. 3, recessed/protruding portions 14ct and recessed/protruding portions 14ct' are provided on an outer (upper) surface of the second inorganic film 14c. The recessed/protruding portions 14ct are formed by performing an intermittent plasma processing step, which will be described later, when forming the second inorganic film 14c. The recessed/protruding portions 14ct' are formed in accordance with the recessed/protruding portions 14bt, which have been formed on the organic film 14b, during formation of the second inorganic film 14c. That is to say, compared with the recessed/protruding portions 14at of the first inorganic film 14a, a greater number of recessed/protruding portions 14ct and recessed/protruding portions 14ct' having recessed/protruding shapes are provided on the second inorganic film 14c. In addition, the recessed/protruding shapes of the recessed/protruding portions 14ct and the recessed/protruding portions 14ct' are aperiodically (randomly) provided on the aforementioned surface as is the case with those of the recessed/protruding portions 14at, and the recessed/protruding dimensions (i.e., dimensions of the differences in height of the recessed/protruding shapes on the aforementioned surface) of the recessed/protruding portions 14at are values within a range of several tens of nanometers to several hundreds of nanometers, for example, and preferably 30 nm to 300 nm.

As described above, in the organic EL display device 1 of the present embodiment, the first inorganic film 14a, the organic film 14b, and the second inorganic film 14b, which are included in the sealing layer 14, are provided with the recessed/protruding portions 14at, 14bt, and 14ct and 14ct', respectively, so that optical interference at interfaces between the first inorganic film 14a, the organic film 14b, and the second inorganic film 14b can be suppressed, and in this manner, the optical characteristics of the organic EL display device 1 can be improved (further details will be described later).

Next, a method for manufacturing the organic EL display device 1 of the present embodiment will be specifically described with reference to FIGS. 4 to 6.

Figure 4:
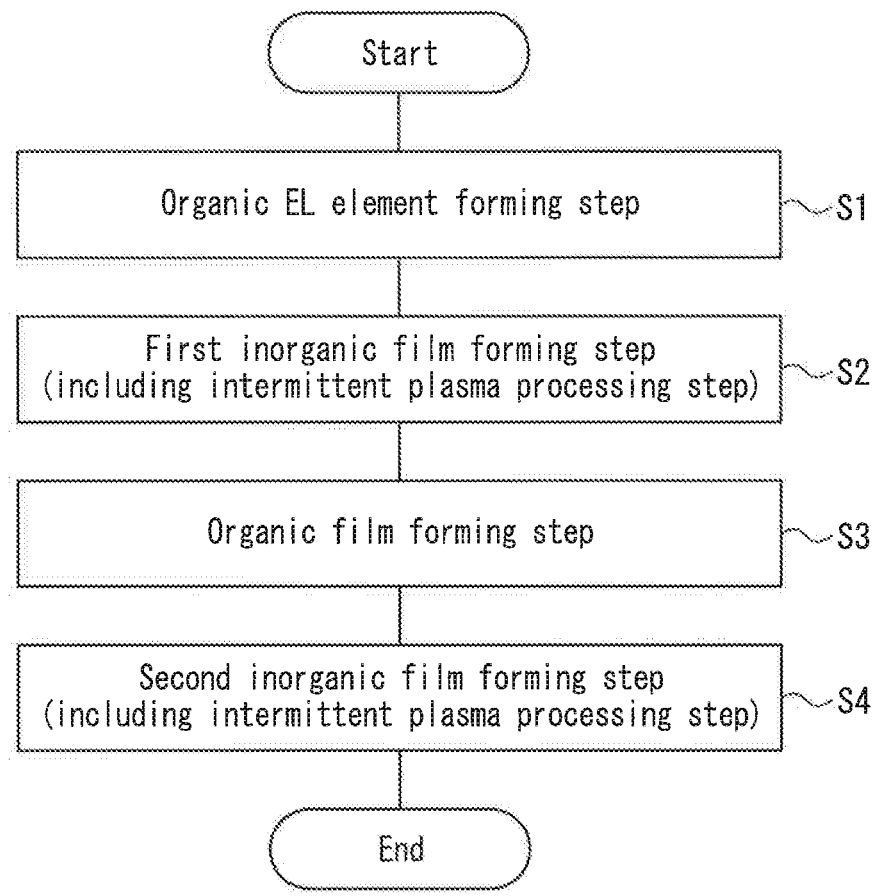
FIG. 4 is a flow chart illustrating manufacturing steps for the organic EL display device.

FIG. 4 is a flow chart illustrating manufacturing steps for the above-described organic EL display device. FIG. 5 is a plan view illustrating a mask that is used in a first inorganic film forming step, an organic film forming step, and a second inorganic film forming step that are illustrated in FIG. 4. FIG. 6 illustrates specific manufacturing steps of the first inorganic film forming step, the organic film forming step, and the second inorganic film forming step, and FIGS. 6(a) to 6(c) illustrate a series of main manufacturing steps.

As stated in step S1 in FIG. 4, to manufacture the organic EL display device 1 of the present embodiment, first, an organic EL element forming step of forming the organic EL element 4 on the TFT substrate 2 is performed. In this organic EL element forming step, constituent elements, such as the TFTs 7 and the interconnects 8, of the organic EL element 4 are sequentially formed on the base film 6.

Next, as stated in step S2 in FIG. 4, a first inorganic film forming step of forming the first inorganic film 14a on the organic EL element 4 so as to cover the organic EL element 4 is performed. In this first inorganic film forming step, the first inorganic film 14a is formed by using plasma CVD, for example.

Moreover, the first inorganic film forming step includes an intermittent plasma processing step of forming the recessed/protruding portions 14at on the surface of the first inorganic film 14a by turning on and off the power supply of the plasma. More specifically, the intermittent plasma processing step is configured such that the recessed/protruding portions 14at are formed by turning on the power supply of the plasma for 10 to 120 seconds and then turning off the power supply of the plasma for 1 to 10 seconds. That is to say, in the intermittent plasma processing step, film formation on the surface of the first inorganic film 14a is partially and randomly performed by turning on and off the power supply of the plasma, and thus, the recessed/protruding portions 14at are formed on that surface.

Subsequently, as stated in step S3 in FIG. 4, an organic film forming step of forming the organic film 14b on the first inorganic film 14a is performed. In this organic film forming step, the organic film 14b is formed by using (plasma) CVD, sputtering, vapor deposition, or vapor deposition polymerization, for example. In addition, during the organic film forming step, the recessed/protruding portions 14bt are formed on the surface of the organic film 14b in accordance with the recessed/protruding portions 14at of the first inorganic film 14a.

Next, as stated in step S4 in FIG. 4, a second inorganic film forming step of forming the second inorganic film 14c on the organic film 14b is performed. In this second inorganic film forming step, the second inorganic film 14c is formed by using plasma CVD, for example.

Moreover, the second inorganic film forming step includes an intermittent plasma processing step of forming the recessed/protruding portions 14ct and the recessed/protruding portions 14ct' on the surface of the second inorganic film 14c by turning on and off the power supply of the plasma. More specifically, the intermittent plasma processing step is configured such that the recessed/protruding portions 14ct and the recessed/protruding portions 14ct' are formed by turning on the power supply of the plasma for 10 to 120 seconds and then turning off the power supply of the plasma for 1 to 10 seconds. That is to say, in the intermittent plasma processing step, film formation on the surface of the second inorganic film 14c is partially and randomly performed by turning on and off the power supply of the plasma, and thus, the recessed/protruding portions 14ct and the recessed/protruding portions 14ct' are formed on the second inorganic film 14c.

As a result of performing the above-described first inorganic film forming step, organic film forming step, and second inorganic film forming step, a sealing layer forming step of forming the sealing layer 14 on the organic EL element 4 of the organic EL display device 1 of the present embodiment, the sealing layer 14 sealing the organic EL element 4, has been completed.

With respect to the organic EL display device 1 of the present embodiment, the organic film 14b is formed in the organic film forming step preferably by using CVD. Thus, the organic film 14b of the organic EL display device 1 of the present embodiment can be formed within the same chamber as the first inorganic film 14a and the second inorganic film 14c, so that the first inorganic film 14a, the organic film 14b, and the second inorganic film 14c can be successively formed with the same mask remaining in intimate contact with the TFT substrate 2.

Figure 5:
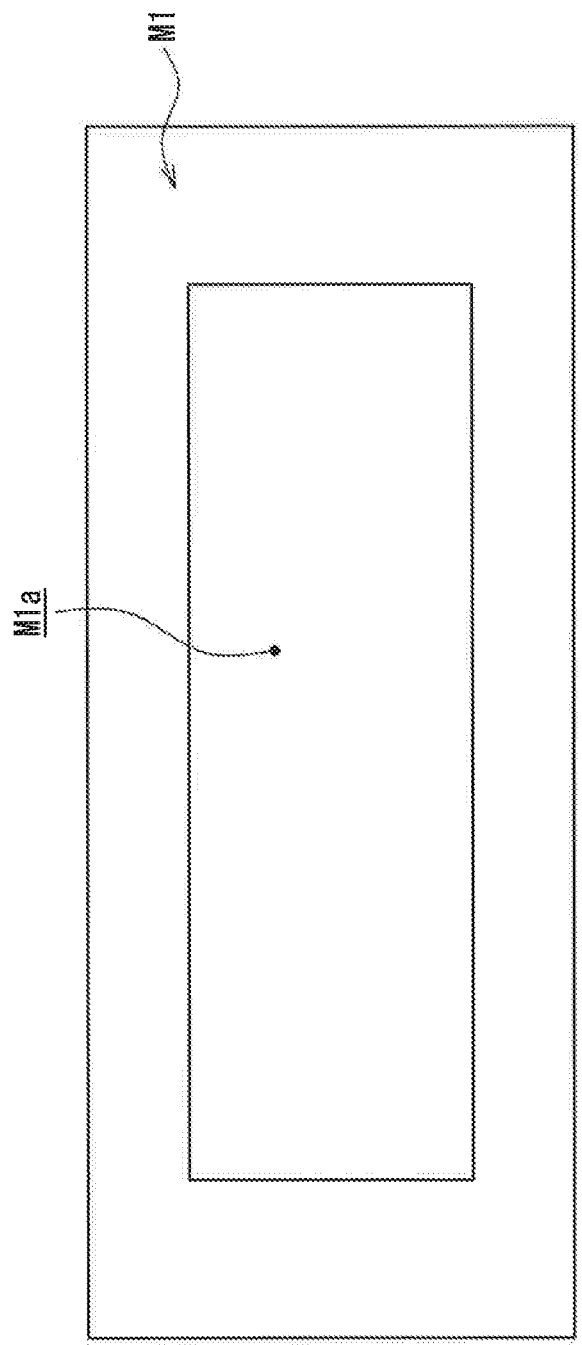
FIG. 5 is a plan view illustrating a mask that is used in a first inorganic film forming step, an organic film forming step, and a second inorganic film forming step illustrated in FIG. 4.
Figure 6:
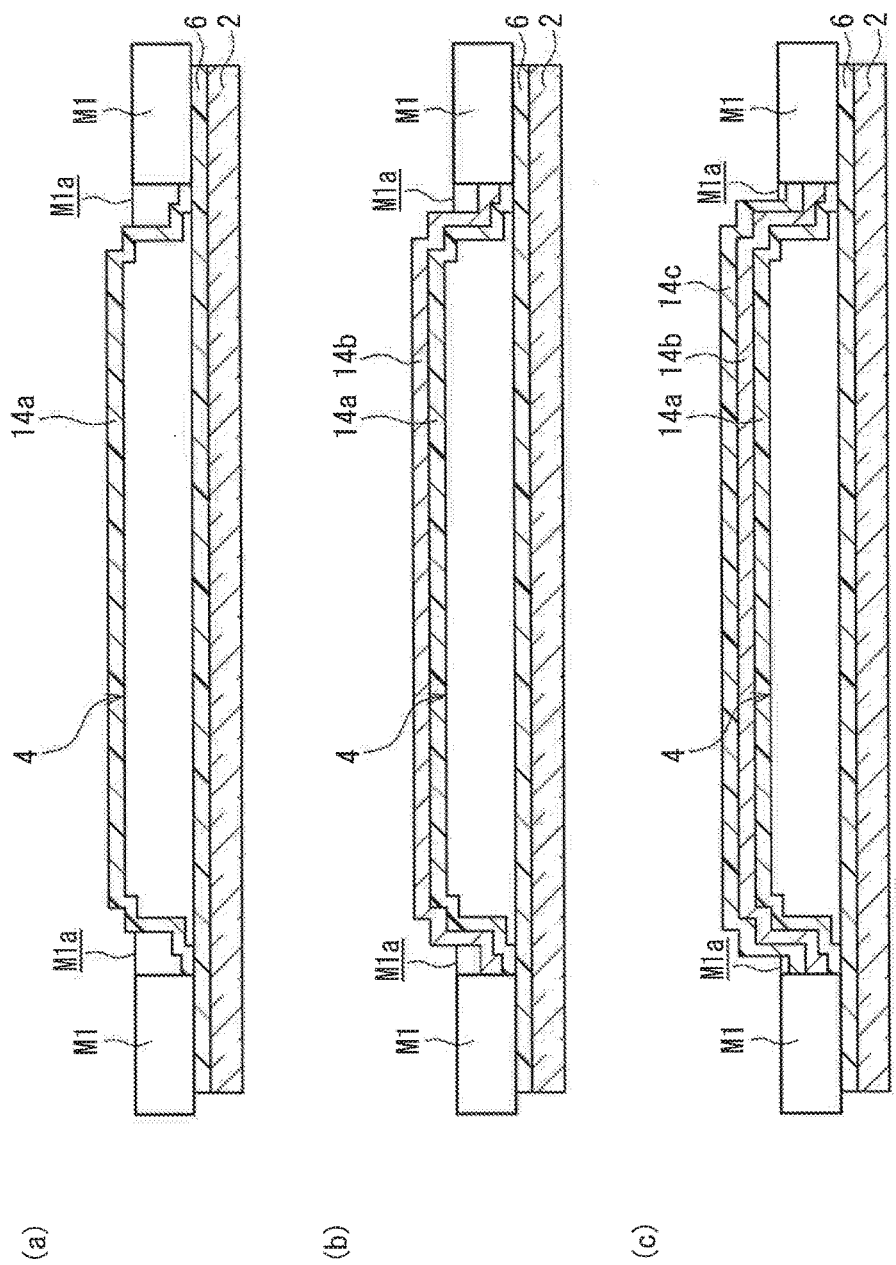
FIG. 6 illustrates specific manufacturing steps of the first inorganic film forming step, the organic film forming step, and the second inorganic film forming step.

More specifically, in the above-described sealing layer forming step, all of the first inorganic film 14a, the organic film 14b, and the second inorganic film 14c are formed using a mask M1 shown in FIG. 5. That is to say, as shown in FIG. 5, the mask M1 includes an opening M1a, and the organic EL element 4 on the TFT substrate 2 is to be disposed within this opening M1a.

Then, as shown in FIG. 6(a), the first inorganic film 14a is formed so as to cover the organic EL element 4.

Subsequently, as shown in FIG. 6(b), the organic film 14b is formed on the first inorganic film 14a.

After that, as shown in FIG. 6(c), the second inorganic film 14c is formed on the organic film 14b.

Hereinafter, the effect of the recessed/protruding portions 14at, the recessed/protruding portions 14bt, the recessed/protruding portions 14ct, and the recessed/protruding portions 14ct' will be specifically described with reference to FIGS. 7 and 8.

Figure 7:
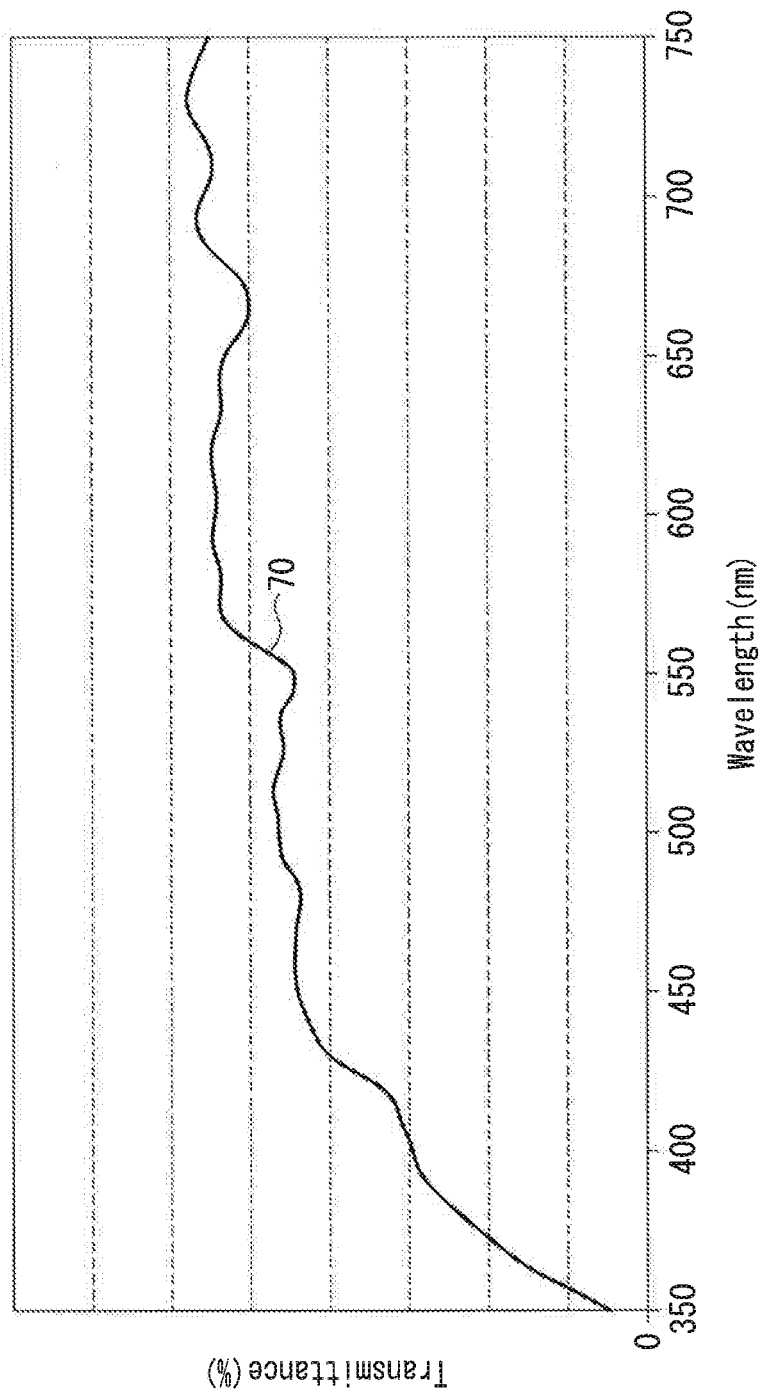
FIG. 7 is a graph illustrating a specific example of optical characteristics of a product according to the present embodiment.

FIG. 7 is a graph illustrating a specific example of the optical characteristics of a product according to the present embodiment. FIG. 8 is a graph illustrating a specific example of the optical characteristics of a comparative product.

The inventors of the present invention prepared a product according to the embodiment, in which the first inorganic film 14a, the organic film 14b, and the second inorganic film 14c were provided with the recessed/protruding portions 14at, the recessed/protruding portions 14bt, and the recessed/protruding portions 14ct and the recessed/protruding portions 14ct', respectively, and a comparative product in which a first inorganic film, an organic film, and a second inorganic film were not provided with recessed/protruding portions. With respect to the product according to the present embodiment and the comparative product, the relationship between the wavelength of light that was transmitted through the laminated films (sealing layer) and emitted to the outside and the transmittance was examined.

As indicated by a solid line 70 in FIG. 7, with respect to the product according to the present embodiment, it was found that a decrease in the transmittance of the emitted light at a specific wavelength hardly occurred. That is to say, with respect to the product according to the present embodiment, it was demonstrated that optical interference, which will be described later, was suppressed, and also a drop in light emission intensity at a specific wavelength due to the optical interference was suppressed.

Figure 8:
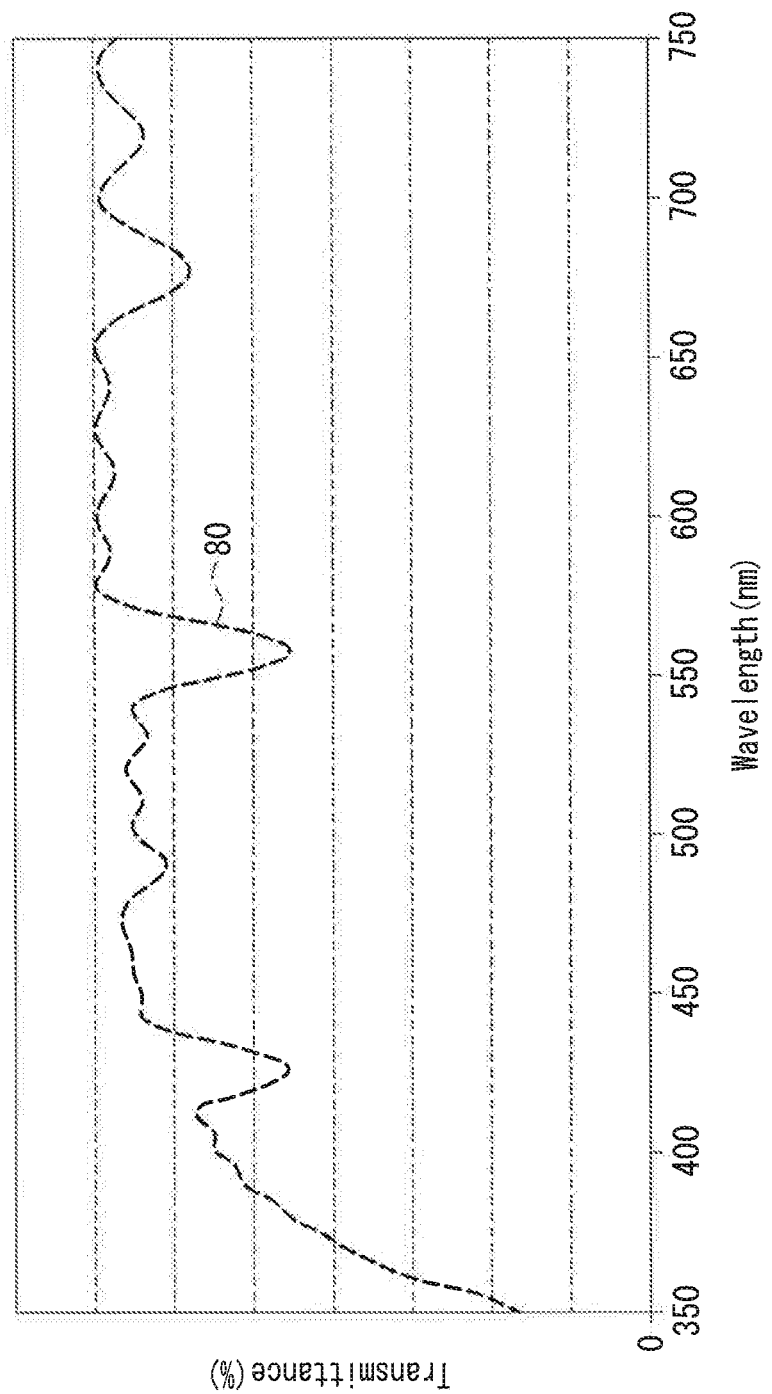
FIG. 8 is a graph illustrating a specific example of optical characteristics of a comparative product.

On the other hand, as indicated by a dashed line 80 in FIG. 8, with respect to the comparative product, a decrease in the transmittance of the emitted light occurred at a specific wavelength. Specifically, the transmission spectrum dropped at about 430 nm, 550 nm, and 670 nm. Also, as indicated by the graph of the dashed line 80, a waving phenomenon having a period of 100 nm or less occurred in the transmission spectrum. That is to say, with respect to the comparative product, optical interference was not suppressed, and also a drop in light emission intensity at a specific wavelength due to the optical interference was not suppressed.

In other words, as in the case of the comparative product, unlike the product according to the present embodiment, no recessed/protruding portions are provided at the interfaces between the first inorganic film, the organic film, the second inorganic film, and the outside air (atmosphere), and therefore, these interfaces are flat. Moreover, the sealing layer including these flat interfaces has a periodic refractive-index structure, which results in optical interference in which light reflected by the interfaces causes interference. The wavelength and intensity of light emitted to the outside depend on the film thicknesses and the differences in refractive index of the films constituting the sealing layer. Moreover, if optical interference occurs, the emission spectrum passing through the surface is affected, and therefore, the chromaticity of light emitted from the organic EL element changes. Furthermore, since the apparent periodic thickness in an oblique field of view is different from that in the front field of view, the wavelength at which optical interference occurs is different. Accordingly, the problem also arises in that the chromaticity varies depending on the viewing angle.

On the other hand, with respect to the product according to the present embodiment, since the recessed/protruding portions 14*at*, the recessed/protruding portions 14*bt*, the recessed/protruding portions 14*ct*, and the recessed/protruding portions 14*ct'* are provided, the regularity of the periodic structure of the sealing layer 14 is disturbed, and also scattering of light occurs. Thus, optical interference can be suppressed. In particular, in the present embodiment, the upper inorganic film, that is, the second inorganic film 14*c* has a larger amount of recessed/protruding shapes of the recessed/protruding portions 14*ct* and the recessed/protruding portions 14*ct'* on the surface thereof, and therefore, the effect of suppressing optical interference at the interface between the second inorganic film 14*c* and atmosphere becomes more pronounced. Consequently, in the present embodiment, as indicated by the solid line 70 in FIG. 7, a decrease in the transmittance at a specific wavelength, for example, at about 430 nm, 550 nm, and 670 nm hardly occurred, and almost no waving phenomenon having a period of 100 nm or less occurred in the graph of transmittance.

Moreover, with respect to the product according to the present embodiment, since the recessed/protruding portions 14*at* and the recessed/protruding portions 14*bt* are provided, the adhesion between the first inorganic film 14*a* and the organic film 14*b* and the adhesion between the organic film 14*b* and the second inorganic film 14*c* can be improved. Consequently, with respect to the product according to the present embodiment, even if stress is applied to the interface between the first inorganic film 14*a* and the organic film 14*b* and the interference between the organic film 14*b* and the second inorganic film 14*c* due to the ambient temperature, the bending stress that develops when the TFT substrate 2 is bent, or the like, peeling at these interfaces can be prevented.

In the organic EL display device 1 of the present embodiment that is configured as described above, the sealing layer 14 seals the organic EL element (electroluminescent element) 4. Also, the recessed/protruding portions 14*at*, the recessed/protruding portions 14*bt*, and the recessed/protruding portions 14*ct* and the recessed/protruding portions 14*ct'* are provided on the surfaces of the first inorganic film 14*a*, the organic film 14*b*, and the second inorganic film 14*c*, respectively, that are included in the sealing layer 14. Also, the recessed/protruding portions 14*at*, the recessed/protruding portions 14*bt*, and the recessed/protruding portions 14*ct* and the recessed/protruding portions 14*ct'* are formed during the respective film-forming steps of the corresponding first inorganic film 14*a*, organic film 14*b*, and second inorganic film 14*c*. Thus, according to the present embodiment, unlike the above-described conventional examples, an organic EL display device (electroluminescent device) 1 whose optical characteristics can be improved in a simple manner can be configured.

Moreover, in the present embodiment, the sealing layer 14 includes the first inorganic film 14*a*, the organic film 14*b*, and the second inorganic film 14*c*, which are sequentially provided from the organic EL element 4 side. Thus, an organic EL display device 1 with excellent barrier properties for the organic EL element 4 can be easily configured.

Moreover, in the present embodiment, the recessed/protruding portions 14*at*, the recessed/protruding portions 14*bt*, the recessed/protruding portions 14*ct*, and the recessed/protruding portions 14*ct'* are aperiodically provided. Thus, scattering of light can be facilitated, and optical interference can be suppressed. Consequently, an organic EL display device 1 having excellent optical characteristics can be easily configured.

Moreover, in the present embodiment, the recessed/protruding dimensions of the recessed/protruding portions 14*at*, the recessed/protruding portions 14*bt*, and the recessed/protruding portions 14*ct* are values within a range of several tens of nanometers to several hundreds of nanometers, and preferably 30 nm to 300 nm. This means that minute recessed/protruding shapes are formed at the recessed/protruding portions 14*at*, the recessed/protruding portions 14*bt*, the recessed/protruding portions 14*ct*, and the recessed/protruding portions 14*ct'*. Thus, optical characteristics can be improved in a simpler manner, and the adhesion at the interfaces between the films on which the recessed/protruding portions 14*at*, the recessed/protruding portions 14*bt*, and the recessed/protruding portions 14*ct* and the recessed/protruding portions 14*ct'* are provided can be improved. That is to say, at the interfaces between the films, the contact area increases, and also the anchoring effect appears, so that the adhesion is improved.

Moreover, according to the present embodiment, the first inorganic film forming step, the organic film forming step, and the second inorganic film forming step are successively performed within the same chamber. Thus, an organic EL display device 1 that is inexpensive in cost can be easily configured by simplifying the manufacturing steps, and also deterioration in reliability of the organic EL display device 1 due to contamination of dust or intrusion of oxygen and/or moisture can be suppressed in a simple manner.

Moreover, according to the present embodiment, in the intermittent plasma processing steps, the power supply of the plasma is turned on for 10 to 120 seconds and then turned off for 1 to 10 seconds. Thus, the recessed/protruding portions 14*at*, the recessed/protruding portions 14*bt*, the recessed/protruding portions 14*ct*, and the recessed/protruding portions 14*ct'* can be properly formed, so that an organic EL display device 1 whose optical characteristics can be improved in a simple manner can be reliably configured.

Second Embodiment

Figure 9:
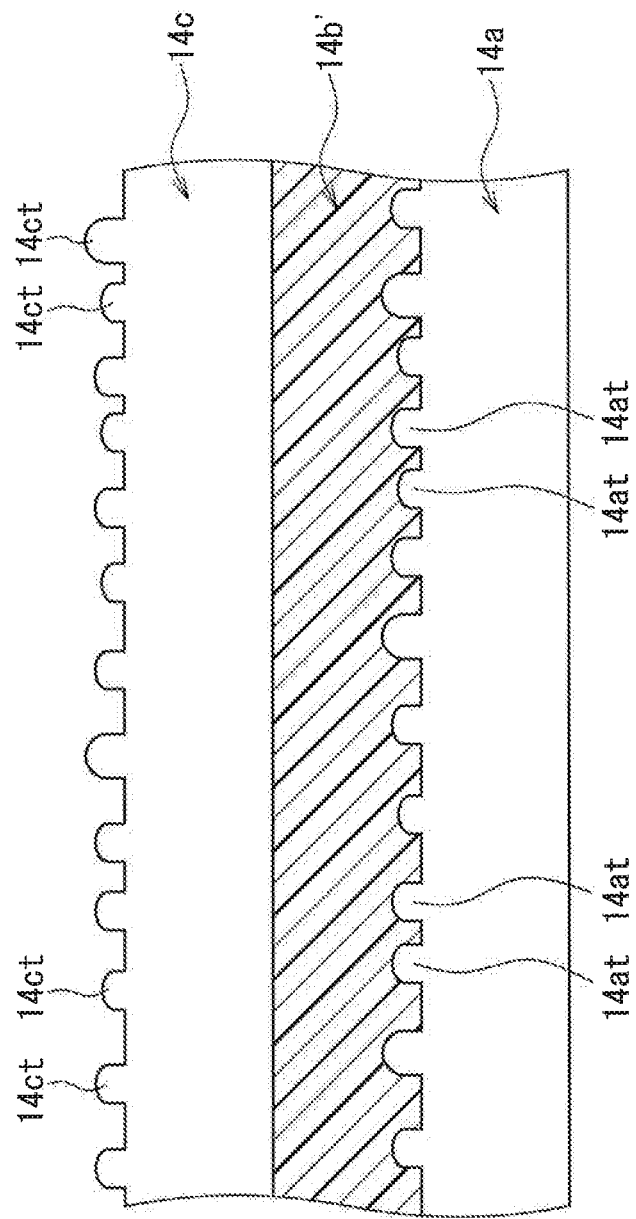
FIG. 9 is an enlarged cross-sectional view showing a specific configuration of a sealing layer of an organic EL display device according to a second embodiment of the present invention.

FIG. 9 is an enlarged cross-sectional view showing a specific configuration of a sealing layer of an organic EL display device according to a second embodiment of the present invention.

In the drawings, the present embodiment differs from the above-described first embodiment mainly in that the organic film is planarized. It should be noted that elements that are the same as those of the above-described first embodiment are denoted by the same reference numerals, and their redundant description is omitted.

That is to say, as shown in FIG. 9, in the organic EL display device 1 of the present embodiment, an organic film 14*b'* has been subjected to planarization treatment and is thus planarized. On the other hand, the recessed/protruding portions 14*at* and the recessed/protruding portions 14*ct* are provided on the surfaces of the first inorganic film 14*a* and the second inorganic film 14*c*, respectively, as is the case with those of the first embodiment.

Next, a method for manufacturing the organic EL display device 1 of the present embodiment will be specifically described with reference to FIG. 10.

Figure 10:
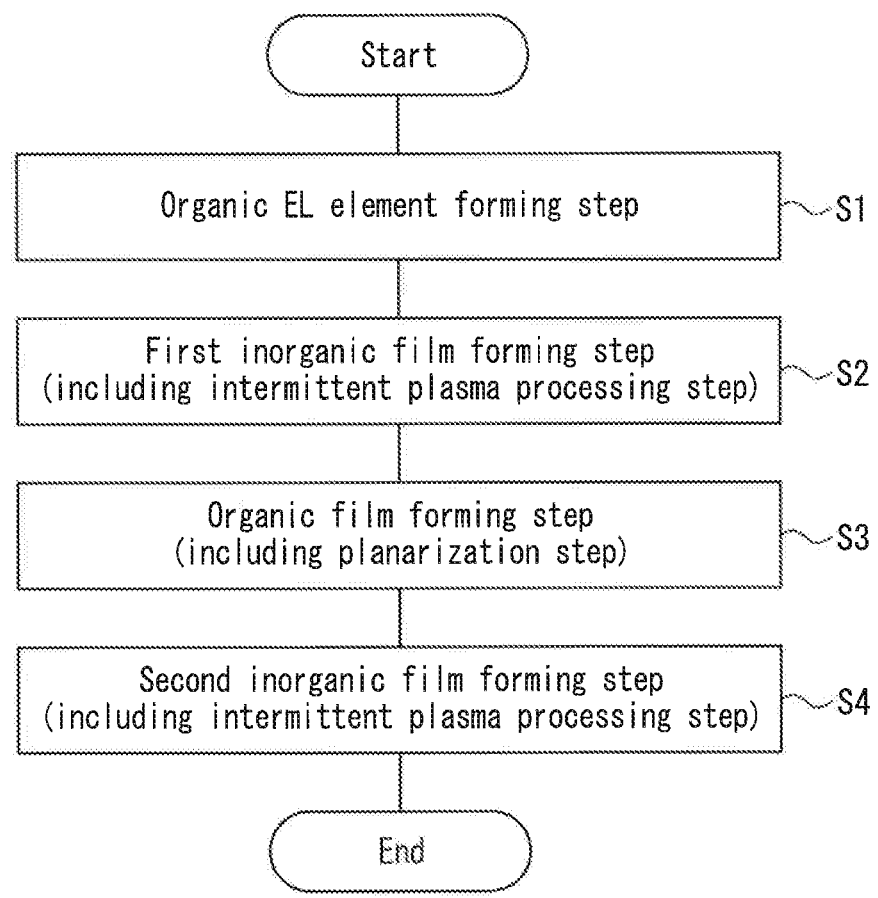
FIG. 10 is a flow chart illustrating manufacturing steps for the organic EL display device shown in FIG. 9.

FIG. 10 is a flow chart illustrating manufacturing steps for the organic EL display device shown in FIG. 9.

As stated in step S3 in FIG. 10, in the present embodiment, the organic film forming step includes a planarization step. More specifically, in this organic film forming step, a monomer having high flowability is formed by using vapor deposition or the like, and due to the monomer flowing, the organic film 14*b'* with a smooth surface is formed. After that, UV irradiation or the like is performed to polymerize the monomer, thereby forming a polymer (macromolecule) and thus causing conversion to an organic film 14*b'* that does not have flowability.

It should be noted that, apart from the foregoing description, the organic film 14*b'* can also be formed by using a coating method such as a printing method or an ink jet method. However, the case where the organic film 14*b'* is formed under a vacuum environment within the same chamber as the first inorganic film 14*a* and the second inorganic film 14*c*, which are formed through a vacuum process, is preferred in that contamination of dust can be prevented, and an increase in cost can be suppressed.

Configured as described above, the present embodiment can have effects similar to those of the above-described first embodiment. Moreover, according to the present embodiment, since the organic film 14*b'* is planarized, the second inorganic film 14*c* can be easily formed. That is to say, if the surface of the organic film 14*b'* has recessed/protruding portions, internal stress of the second inorganic film 14*c* is concentrated on those recessed/protruding portions, and this may lead to peeling of the film; however, since the organic film 14*b'* is planarized, concentration of the internal stress of the second inorganic film 14*c* can be suppressed. Accordingly, the margin for the internal stress of the second inorganic film 14*c* can be increased. Furthermore, in FIG. 3, which shows the first embodiment, the recessed/protruding portions 14*at* on the surface of the first inorganic film 14*a* are carried over even to the second inorganic film 14*c*, and thus, the upper inorganic film has higher density of recessed/protruding portions thereon, which in turn results in more scattering of light. However, according to the present embodiment, as shown in FIG. 9, the recessed/protruding portions 14*at* on the surface of the first inorganic film 14*a* are not carried over to the second inorganic film 14*c*, and the recessed/protruding portions 14*at* and 14*ct* on the respective first and second inorganic films 14*a* and 14*c* have almost the same density on both of the layers (i.e., the first and second inorganic films 14*a* and 14*c*). Accordingly, the degree of scattering of light is almost the same, and thus, optical design becomes easier.

Third Embodiment

Figure 11:
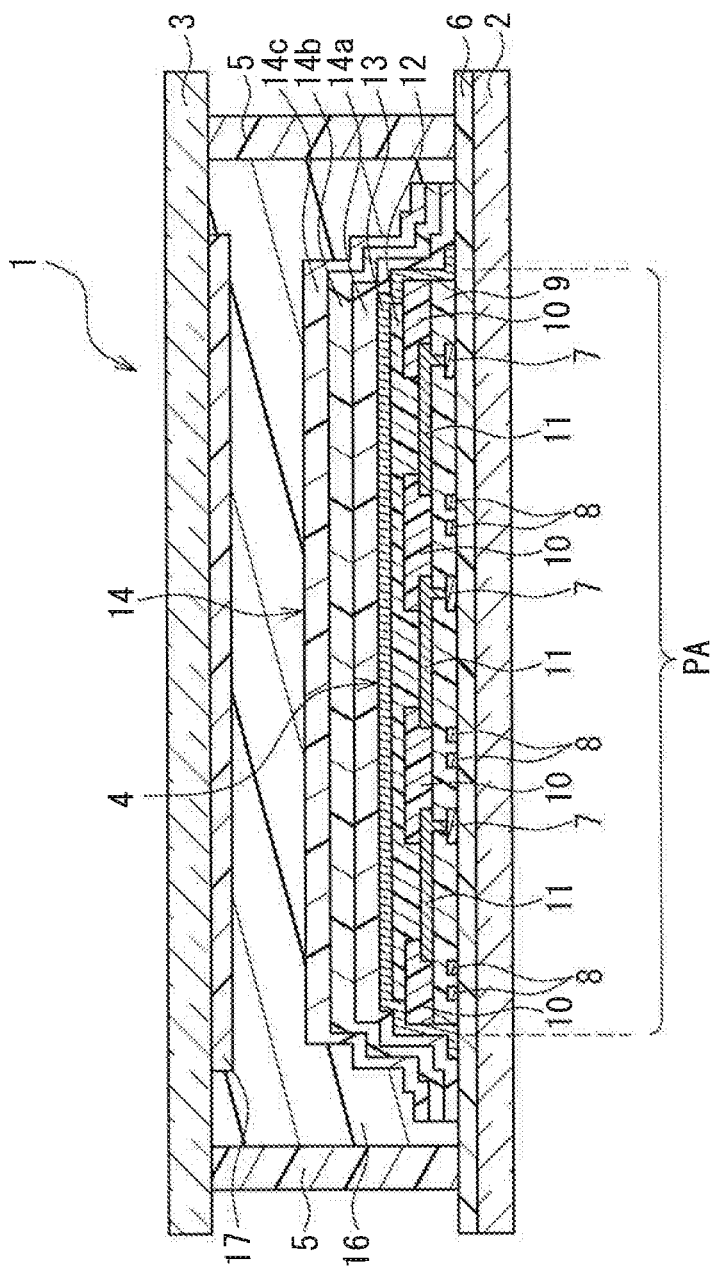
FIG. 11 is a cross-sectional view showing a cross section of an organic EL display device according to a third embodiment of the present invention.
Figure 12:
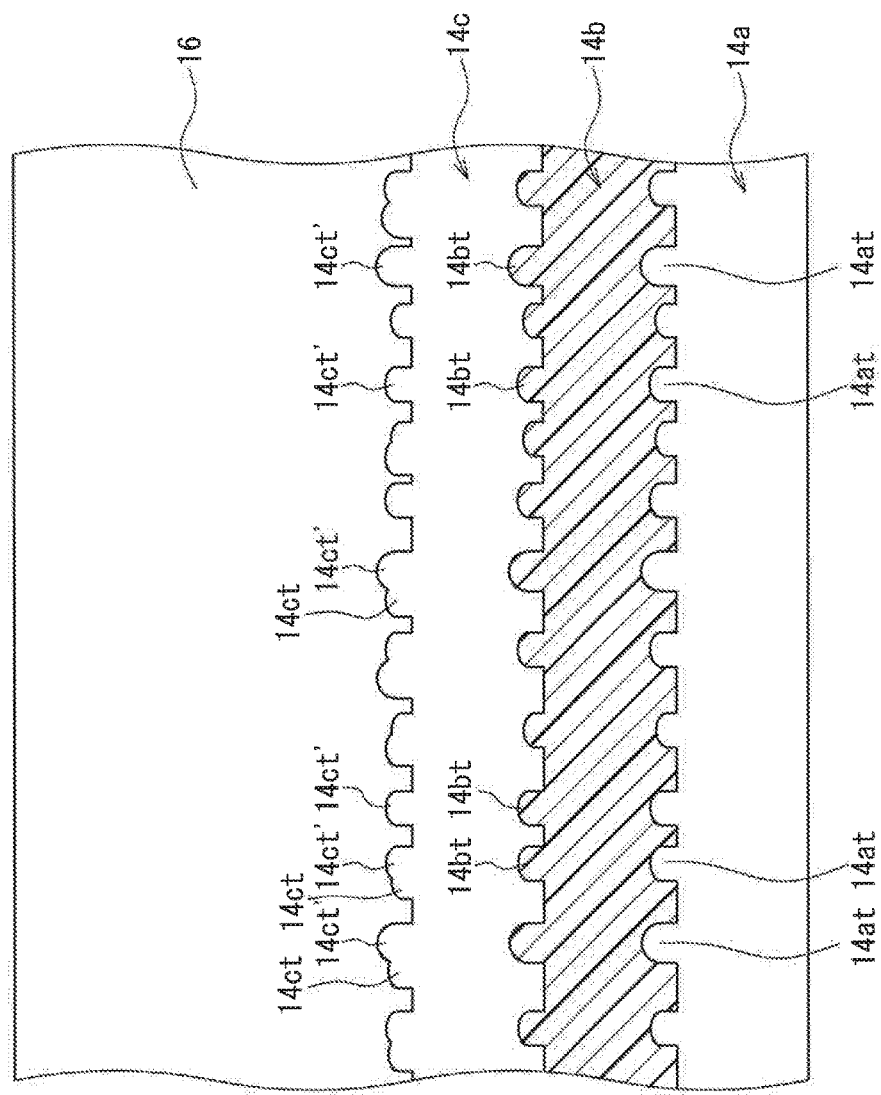
FIG. 12 is an enlarged cross-sectional view showing a specific configuration of a sealing layer and a filler layer shown in FIG. 11.

FIG. 11 is a cross-sectional view showing a cross section of an organic EL display device according to a third embodiment of the present invention. FIG. 12 is an enlarged cross-sectional view showing a specific configuration of a sealing layer and a filler layer that are shown in FIG. 11.

In the drawings, the present embodiment differs from the above-described first embodiment mainly in that an opposing substrate that opposes the TFT substrate and a frame-like sealing material that encloses the organic EL element between the TFT substrate and the opposing substrate are provided. It should be noted that elements that are the same as those of the above-described first embodiment are denoted by the same reference numerals, and their redundant description is omitted.

That is to say, as shown in FIG. 11, in the organic EL display device 1 of the present embodiment, the organic EL element 4 is enclosed by the TFT substrate 2, an opposing substrate 3 that is provided opposing the TFT substrate 2, and a frame-like sealing material 5 that is provided between the TFT substrate 2 and the opposing substrate 3.

As in the case of the TFT substrate 2, for example, a glass material or a film or the like that has flexibility (bendability) is used as the opposing substrate 3. Moreover, a color filter 17 is provided on a surface of the opposing substrate 3 that faces toward the organic EL element 4 to thereby improve the light-emitting characteristics, such as light-emitting quality, of the above-described RGB subpixels.

The sealing material 5 is composed of a material in which, for example, a spacer that defines a cell gap between the TFT substrate 2 and the opposing substrate 3 as well as inorganic particles are dispersed in a resin such as epoxy resin, and the sealing material 5 is formed in the form of a frame around the pixel area PA. Moreover, as a result of dispersing the inorganic particles, the moisture permeability of the sealing material 5 can be reduced even more.

Moreover, in the organic EL display device 1 of the present embodiment, a filler layer 16 is provided so as to cover the organic EL element 4 among the TFT substrate 2, the opposing substrate 3, and the sealing material 5. A material in which a metallic oxide, such as aluminum hydroxide or calcium oxide, or activated charcoal is dispersed in a resin is used for the filler layer 16.

Moreover, as shown in FIG. 12, in the organic EL display device 1 of the present embodiment, the recessed/protruding portions 14*at*, the recessed/protruding portions 14*bt*, and the recessed/protruding portions 14*ct* and the recessed/protruding portions 14*ct*' are provided on the surfaces of the first inorganic film 14*a*, the organic film 14*b*, and the second inorganic film 14*c*, respectively. That is to say, as shown in FIG. 12, the recessed/protruding portions 14*at* are provided at the interface between the first inorganic film 14*a* and the organic film 14*b*. The recessed/protruding portions 14*bt* are provided at the interface between the organic film 14*b* and the second inorganic film 14*c*. The recessed/protruding portions 14*ct* and the recessed/protruding portions 14*ct*' are provided at the interface between the second inorganic film 14*c* and the filler layer 16.

Next, manufacturing steps for the organic EL display device 1 of the present embodiment will be specifically described with reference to FIGS. 13 and 14. It should be noted that, in the following description, a step of applying the filler layer 16 and a step of bonding the TFT substrate 2 and the opposing substrate 3 together will be mainly described.

Figure 13:
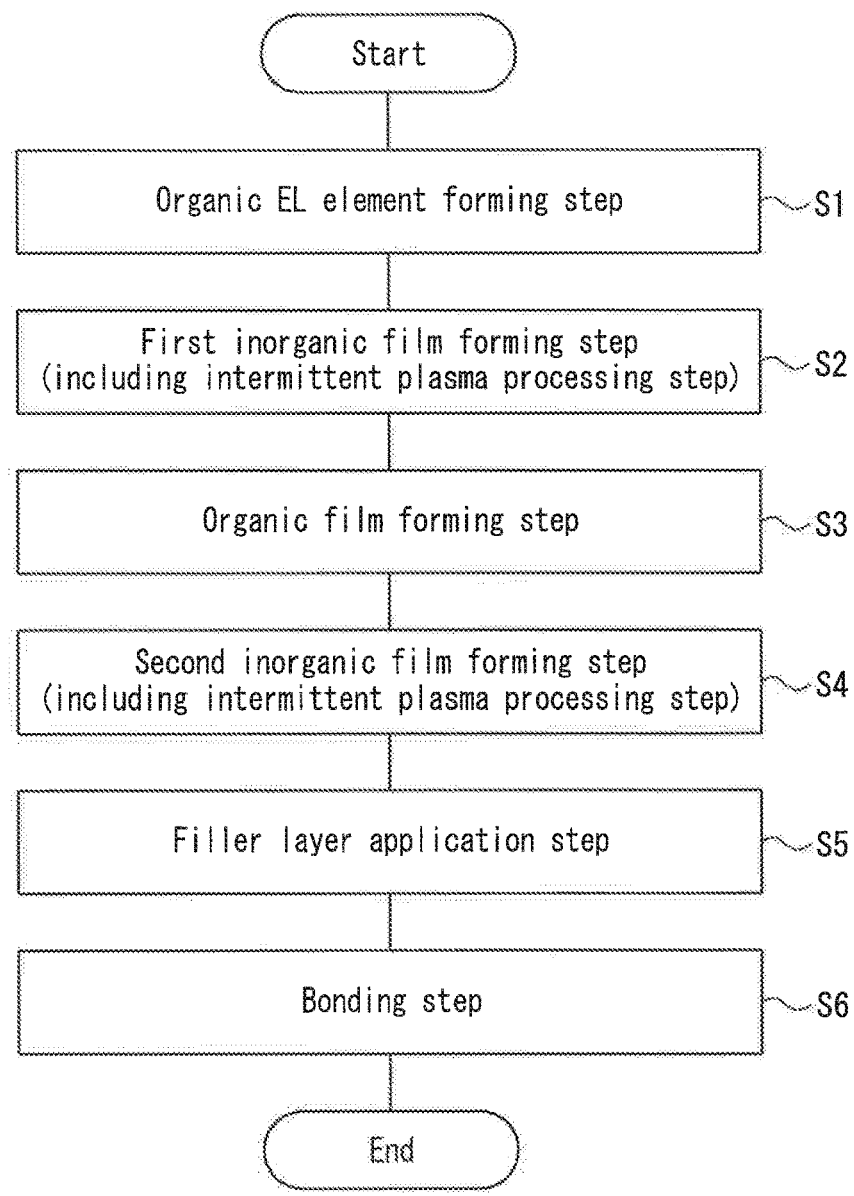
FIG. 13 is a flow chart illustrating manufacturing steps for the organic EL display device shown in FIG. 11.
Figure 14:
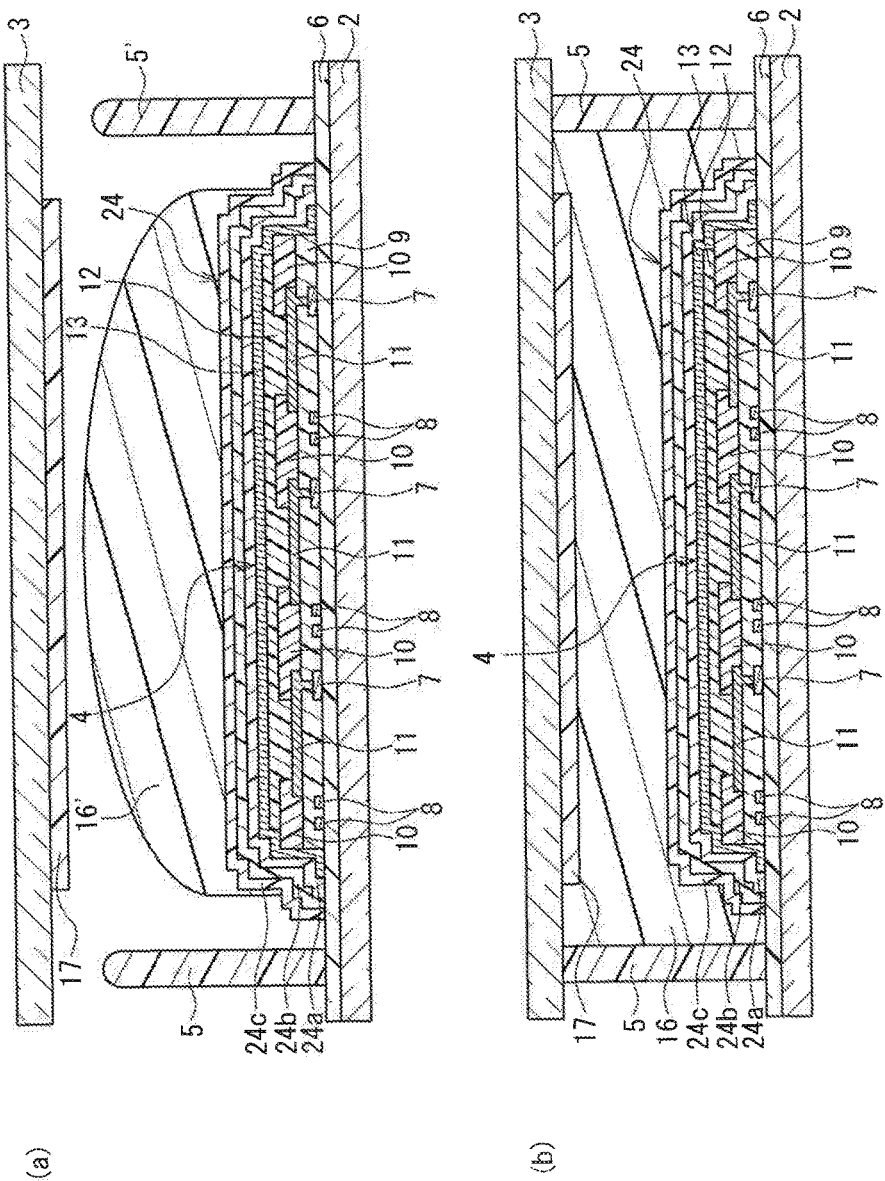
FIGS. 14(a) and 14(b) illustrate a filler layer application step and a bonding step, respectively, illustrated in FIG. 13.

FIG. 13 is a flow-chart illustrating manufacturing steps for the organic EL display device shown in FIG. 11. FIGS. 14(*a*) and 14(*b*) are diagrams illustrating a filler layer application step and a bonding step, respectively, that are illustrated in FIG. 13.

As stated in step S5 in FIG. 13, after the end of the sealing layer forming step, a filler layer application step of applying the filler layer 16 onto the sealing layer 14 is performed. In this filler layer application step, as shown in FIG. 14(*a*), the organic EL element 4 and the sealing layer 14 are formed on the TFT substrate 2. Moreover, a sealing material 5' is provided on the TFT substrate 2 in the form of a frame so as to surround the organic EL element 4, and a filler layer 16' is applied onto the sealing layer 14 by using a coating method, for example.

Meanwhile, the color filter 17 is formed on the surface of the opposing substrate 3 that faces toward the organic EL element 4.

Next, as stated in step S6 in FIG. 13, a bonding step of bonding the TFT substrate 2 and the opposing substrate 3 together is performed. In this bonding step, as shown in FIG. 14(*b*), the TFT substrate 2 is bonded to the opposing substrate 3 under a vacuum atmosphere (e.g., 100 Pa or less). Thus, the organic EL display device 1 of the present embodiment is completed.

Configured as described above, the present embodiment can have effects similar to those of the above-described first embodiment.

Moreover, according to the present embodiment, the opposing substrate 3 that opposes the TFT substrate 2 on the organic EL element 4 side and the frame-like sealing material 5 that encloses the organic EL element 4 between the TFT substrate 2 and the opposing substrate 3 are provided. Thus, according to the present embodiment, deterioration of the organic EL element 4 can be more reliably prevented.

Moreover, according to the present embodiment, since the filler layer 16 is provided among the TFT substrate 2, the opposing substrate 3, and the sealing material 5, the barrier properties for the organic EL element 4 can be increased even more.

Moreover, according to the present embodiment, since the recessed/protruding portions 14*ct* and the recessed/protruding portions 14*ct*' of the second inorganic film 14*c* are provided at the interface between the second inorganic film 14*c* and the filler layer 16, the adhesion between the second inorganic film 14*c* and the filler layer 16 can be improved, and thus, peeling at the interface between the second inorganic film 14*c* and the filler layer 16 can be prevented.

It should be noted that the foregoing embodiments are to be considered in all respects as illustrative and not restrictive. The technical scope of the invention is indicated by the appended claims, and all changes which come within the range of equivalency of the configurations specified in the claims are therefore intended to be embraced therein.

For example, although the case where an organic EL element is used as the electroluminescent element has been described in the foregoing description, the present invention is not limited to this, and, for example, an inorganic EL element containing an inorganic compound may also be used.

Moreover, although the case where the sealing layer constituted by the organic film and the two inorganic films is used has been described in the foregoing description, the present invention is not limited to this, and it is sufficient if a sealing layer is composed of a laminated structure that is constituted by an organic film and an inorganic film, and recessed/protruding portions are provided at least on a surface of the inorganic film in the sealing layer. That is to say, the present invention is also applicable to a laminated structure constituted by a total of four or more organic films and inorganic films.

Moreover, although the configuration in which the recessed/protruding portions are provided on the surfaces of the two inorganic films has been described in the foregoing description, the present invention is not limited to this, and a configuration having an inorganic film without recessed/protruding portions may also be adopted.

Moreover, although the case where the present invention is applied to an active-matrix organic EL display device having the TFTs (thin-film transistors) 7 has been described in the foregoing description, the present invention is not limited to this, and the present invention is also applicable to a passive-matrix organic EL display device in which no thin-film transistor is provided.

Moreover, although the case where the present invention is applied to an organic EL display device has been described in the foregoing description, the present invention is not limited to this, and, for example, the present invention is also applicable to an illumination device such as a backlight device.

Moreover, in addition to the foregoing description, the above-described first to third embodiments may be combined as appropriate.

INDUSTRIAL APPLICABILITY

The present invention is useful for an electroluminescent device whose optical characteristics can be improved in a simple manner and a method for manufacturing the electroluminescent device.

LIST OF REFERENCE NUMERALS

1 Organic EL display device
2 TFT substrate (substrate)
3 Opposing substrate
4 Organic EL element (electroluminescent element)
5 Sealing material
14 Sealing layer
14*a* First inorganic film
14*at* Recessed/protruding portion
14*b*, 14*b*' Organic film 14*bt* Recessed/protruding portion
14*c* Second inorganic film
14*ct*, 14*ct'* Recessed/protruding portion

The invention claimed is:

1. An electroluminescent device comprising:
a substrate;
an electroluminescent element that is provided on the substrate; and
a sealing layer that seals the electroluminescent element,
an opposing substrate that opposes the substrate, and
a frame-shaped sealing material that is provided between the substrate and the opposing substrate and that encloses the electroluminescent element together with the substrate and the opposing substrate, wherein
the sealing layer includes an inorganic film and an organic film,
recessed/protruding portions are provided on a surface of at least the inorganic film, and
a filler layer is provided among the substrate, the opposing substrate, and the sealing material.

2. The electroluminescent device according to claim 1, wherein the sealing layer includes a first inorganic film, an organic film, and a second inorganic film that are sequentially provided from the electroluminescent element side, and
recessed/protruding portions are provided on surfaces of at least the first and second inorganic films.

3. The electroluminescent device according to claim 2, wherein the organic film is planarized.

4. The electroluminescent device according to claim 1, wherein the recessed/protruding portions are aperiodically provided.

5. The electroluminescent device according to claim 1, wherein recessed/protruding dimensions of the recessed/protruding portions are values within a range of 30 nm to 300 nm.

6. The electroluminescent device according to claim 1, wherein a material having flexibility is used for the substrate.

7. The electroluminescent device according to claim 2, wherein recessed/protruding portions are formed on a surface of the organic film that faces toward the second inorganic film in accordance with the recessed/protruding portions provided on the first inorganic film.

8. The electroluminescent device according to claim 7, wherein formation positions and dimensions of the recessed/protruding portions formed on the surface of the organic film are the same as those of the recessed/protruding portions formed on the surface of the first inorganic film, so that the entire organic film has a uniform film thickness.

9. The electroluminescent device according to claim 8, wherein recessed/protruding portions are formed on an outer surface of the second inorganic film in accordance with the recessed/protruding portions formed on the organic film and other recessed/protruding portions are also formed thereon, and
the density of the recessed/protruding portions on the surface of the second inorganic film is higher than the density of the recessed/protruding portions on the surface of the first inorganic film.

10. The electroluminescent device according to claim 9, wherein the other recessed/protruding portions formed on the second inorganic film are formed by an intermittent plasma processing step when forming the second inorganic film.

11. The electroluminescent device according to claim 9, wherein at least one of the recessed/protruding portions formed on the outer surface of the second inorganic film is constituted by the recessed/protruding portion formed in accordance with the recessed/protruding portion formed on the organic film and the other recessed/protruding portion that are overlapped with each other.

12. The electroluminescent device according to claim 3, wherein
recessed/protruding portions are formed on surfaces of the first and second inorganic films, and
the density of the recessed/protruding portions on the surface of the first inorganic film is the same as the density of the recessed/protruding portions on the surface of the second inorganic film.

13. An electroluminescent device comprising:
a substrate;
an electroluminescent element that is provided on the substrate; and
a sealing layer that seals the electroluminescent element, wherein
the sealing layer includes an inorganic film and an organic film,
recessed/protruding portions are provided on a surface of at least the inorganic film,
the sealing layer includes a first inorganic film, an organic film, and a second inorganic film that are sequentially provided from the electroluminescent element side,
recessed/protruding portions are provided on surfaces of at least the first and second inorganic films,
recessed/protruding portions are formed on a surface of the organic film that faces toward the second inorganic film in accordance with the recessed/protruding portions provided on the first inorganic film, and
formation positions and dimensions of the recessed/protruding portions formed on the surface of the organic film are the same as those of the recessed/protruding portions formed on the surface of the first inorganic film, so that the entire organic film has a uniform film thickness.

14. The electroluminescent device according to claim 13, wherein recessed/protruding portions are formed on an outer surface of the second inorganic film in accordance with the recessed/protruding portions formed on the organic film and other recessed/protruding portions are also formed thereon, and
the density of the recessed/protruding portions on the surface of the second inorganic film is higher than the density of the recessed/protruding portions on the surface of the first inorganic film.

15. The electroluminescent device according to claim 14, wherein the other recessed/protruding portions formed on the second inorganic film are formed by an intermittent plasma processing step when forming the second inorganic film.

16. The electroluminescent device according to claim 14, wherein at least one of the recessed/protruding portions formed on the outer surface of the second inorganic film is constituted by the recessed/protruding portion formed in accordance with the recessed/protruding portion formed on the organic film and the other recessed/protruding portion that are overlapped with each other.

17. An electroluminescent device comprising:
a substrate;
an electroluminescent element that is provided on the substrate; and
a sealing layer that seals the electroluminescent element, wherein the sealing layer includes an inorganic film and an organic film,
recessed/protruding portions are provided on a surface of at least the inorganic film,
the sealing layer includes a first inorganic film, an organic film, and a second inorganic film that are sequentially provided from the electroluminescent element side,
recessed/protruding portions are provided on surfaces of at least the first and second inorganic films,
the organic film is planarized,
recessed/protruding portions are formed on surfaces of the first and second inorganic films, and
the density of the recessed/protruding portions on the surface of the first inorganic film is the same as the density of the recessed/protruding portions on the surface of the second inorganic film.

18. The electroluminescent device according to claim 17, wherein the recessed/protruding portions are aperiodically provided.

19. The electroluminescent device according to any claim 18, wherein a material having flexibility is used for the substrate.

\* \* \* \* \*